United States Patent [19]

Matta et al.

[11] Patent Number: 5,053,922
[45] Date of Patent: Oct. 1, 1991

[54] DEMOUNTABLE TAPE-AUTOMATED BONDING SYSTEM

[75] Inventors: Farid Matta, Mountain View; Kevin C. Douglas, San Mateo, both of Calif.

[73] Assignee: Hewlett-Packard Company, Palo Alto, Calif.

[21] Appl. No.: 401,053

[22] Filed: Aug. 31, 1989

[51] Int. Cl.$^5$ .............................................. H05K 7/20
[52] U.S. Cl. ................................... 361/386; 174/52.4; 174/260; 165/185; 361/398; 361/421
[58] Field of Search ................ 427/96, 125, 215, 216, 427/217; 428/457, 458, 461, 901; 357/81; 165/80.3, 185; 174/16.3, 52.4, 252, 255, 257, 260; 361/383, 386–388, 395, 396, 398, 410, 412, 414, 421, 403

[56] References Cited

U.S. PATENT DOCUMENTS

| | | | |
|---|---|---|---|
| 4,450,188 | 5/1984 | Kawasumi | 427/96 |
| 4,658,331 | 4/1987 | Berg | 361/387 |
| 4,695,678 | 9/1987 | Itagaki | 174/52.4 |
| 4,750,089 | 6/1988 | Derryberry | 174/16.3 |
| 4,812,949 | 3/1989 | Fontan | 361/386 |
| 4,868,349 | 9/1989 | Chia | 174/52.4 |
| 4,890,194 | 12/1989 | Derryberry | 174/52.4 |
| 4,903,113 | 2/1990 | Frankeny | 174/52.4 |
| 4,914,551 | 4/1990 | Anschel | 361/386 |

Primary Examiner—Gerald P. Tolin

[57] ABSTRACT

A Demountable Tape-Automated Bonding System for providing connections to a chip is disclosed. The chip is attached to or is held in place on a TAB frame that includes a generally flexible dielectric film which bears a pattern of conductive traces. A multitude of closely-spaced contacts which protrude downward from the chip contact the conductive traces on the TAB frame. The chip may be maintained in its proper location on the TAB frame by either a bonding agent or by compressive forces supplied by a cap which is fastened to the TAB frame and to a substrate, such as a printed circuit board, below the TAB frame. The substrate carries an array of conductive traces around the edges of the substrate. These traces match the traces on the TAB frame. The conductor traces on the TAB frame and on the substrate are held in contact with each other by compressive forces supplied by the cap which is fastened to the TAB frame and to the substrate. An optional bottom plate may be affixed beneath the substrate to provide additional strength and rigidity to the assembly. An optional heat sink may be attached above the cap to conduct away heat generated by the chip. An alternative embodiment of the invention includes an elastomer which is inserted between the cap and the substrate to cushion the compressive forces borne by the chip. The invention may also utilize a heat spreader placed directly above the chip. The Demountable Tape-Automated Bonding System constitutes a major improvement in the electronics industry which provides reliable, removable connections to delicate integrated circuit chips, eliminates the need for soldering, greatly diminishes alignment and bonding requirements, and offers a modular chip package that guards against mechanical, chemical, and electrical threats to its contents.

5 Claims, 4 Drawing Sheets

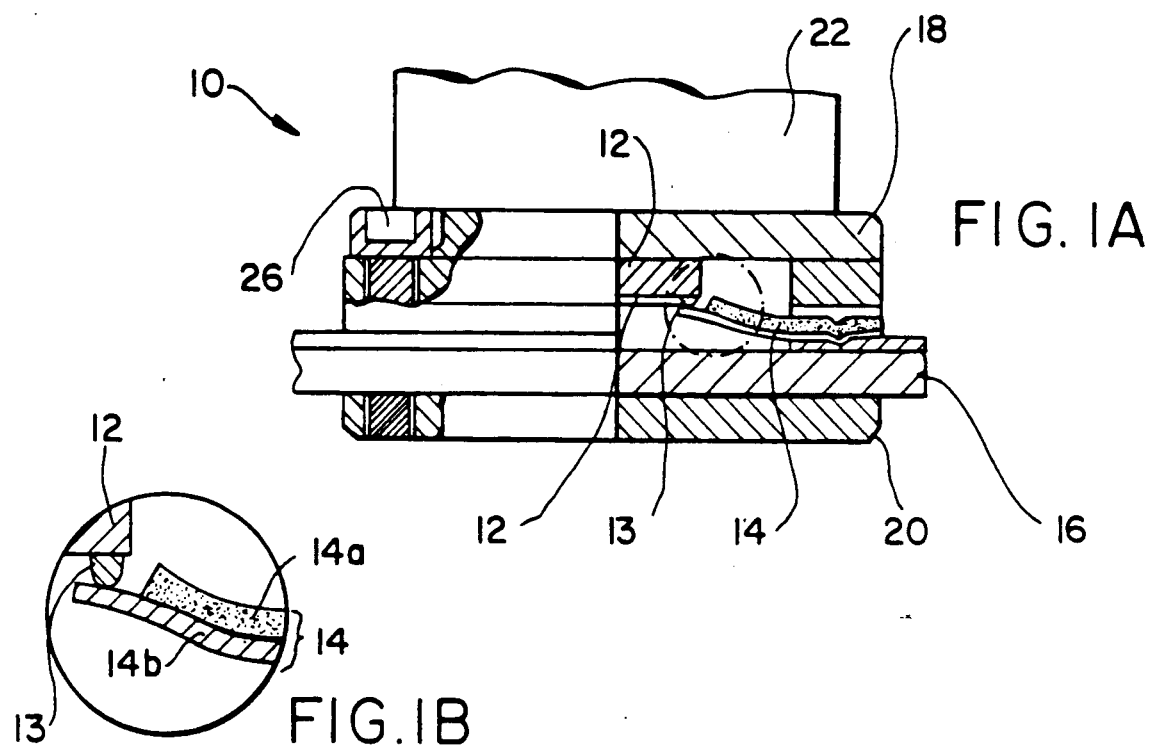
FIG. 1A
FIG. 1B
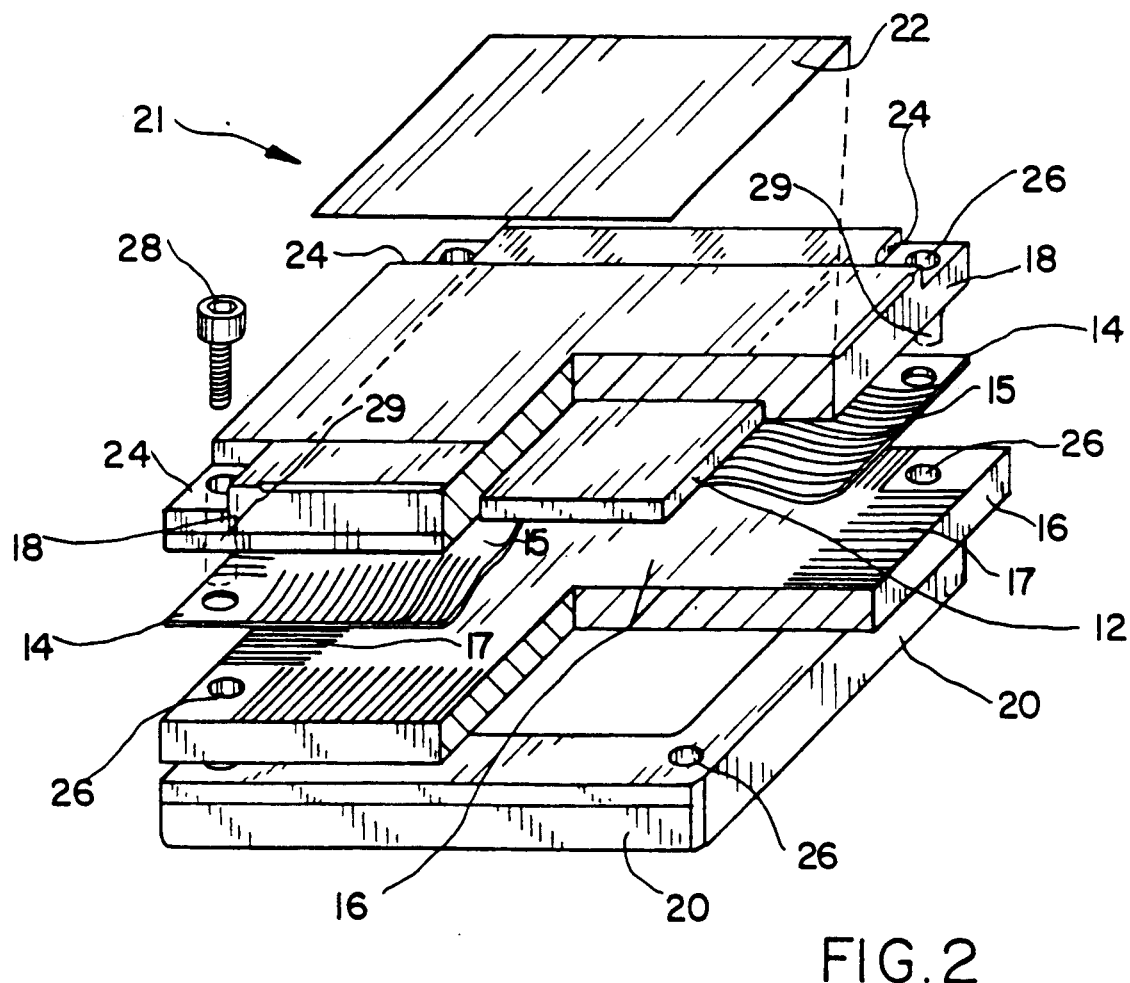
FIG. 2

DEMOUNTABLE TAPE-AUTOMATED BONDING SYSTEM

BACKGROUND OF THE INVENTION

The present invention includes methods and apparatus for making connections to an integrated circuit chip. The Demountable Tape-Automated Bonding System provides a modular, reliable, and self-aligned device that overcomes the main drawbacks of conventional chip interface technology.

Each year integrated circuits become more powerful and capable of storing more information. One of greatest challenges confronting designers in the electronics industry is finding more efficient and reliable methods to access the complex circuitry that resides within the chip package. A large rectangular IC chip having sides less than one half inch in length may have as many as five hundred or more leads extending from it. Each of these conductors must be physically bonded or coupled to external devices. These conductors are spaced together so closely that the center-to-center distance, or "pitch", across a pair of leads may measure less than five mils. As the leads become finer and finer, and as they are arranged in more tightly packed arrays, chances for mechanical failure and electrical short circuits quickly rise to unacceptably high levels.

The basic methods of mass-producing connections to memory or logic chips utilize a technique called "tape-automated bonding". This fabrication procedure is commonly referred to by the acronym "TAB" and is well known to persons ordinarily skilled in the electronics packaging art. A continuous insulative tape which is similar to photographic film provides a planar support for chips that are attached to individual sections or frames of the tape. TAB frames are generally rectangular or square portions that are arranged side-by-side along an uncut tape. A spider-like metal pattern of conductive traces is formed on each frame. The traces radiate from the center of the frame to its four edges. A chip is carefully aligned over the center of the TAB frame, so that the leads or contacts of the chip are precisely mated with the corresponding metal traces in the central portion of the TAB frame. In previous integrated circuit devices, the chip is attached to the TAB frame with a bonding agent. This connection of the chip contacts to the inner portion of the TAB frame is referred to as "inner-lead bonding" or "ILB" technology. The outermost sections of the conductive traces on the TAB frame must also be carefully aligned with a similar set of corresponding traces formed on a substrate. The substrate is attached to the TAB frame on the side that is opposite from the side that is adjacent to the chip. The connection of the outer portion of the TAB frame to a substrate like a printed circuit board pertains to "outer-lead bonding," often called "OLB" technology. The resulting assembly comprising the chip, the TAB frame, and the substrate is essentially a space transformer that employs diverging radial electrical pathways to afford ready access to the integrated circuit.

Conventional manufacturing operations utilize soldering or thermocompression equipment to form metallurgical junctions between the chip contacts and the planar traces as well as between the TAB traces and the substrate. Great quantities of heat and pressure must be applied to the chip, TAB frame, and substrate during these mating processes. Excessive heat and pressure can seriously damage or even destroy the fragile circuitry within the chip. Highly accurate lasers capable of supplying radiant energy with great precision can be employed to diminish the chances for damage due to stray heat, but the basic problem of keeping the chip out of harm's way during a rapid automated manufacturing operation still remains unsolved. The heat expended during conventional procedures also tends to cause the metal and plastic components within the assembly to expand. The resulting deformations can easily ruin the registration of the contacts and the traces. Even if engineers and technicians can manage to coax acceptable yield rates from these methods of fabrication, the finished product is virtually impossible to repair or to service. As chips become more complicated and more expensive, it becomes less and less desirable to throw away entire chip, TAB frame, and substrate assemblies when a breakdown is encountered.

The problem of providing reliable chip-to-TAB frame and TAB frame-to-substrate connection systems that avoid the detrimental side effects that inherently accompany soldering and thermocompression bonding has presented a major challenge to designers in the automated electronic packaging field. The development of a relatively low cost, rugged, and versatile system that does not suffer from the impediments of misalignment and the inability to repair and replace defective chips would constitute a major technological advance in the electronics business. The enhanced performance that could be achieved using such an innovative device would satisfy a long felt need within the industry and would enable electronic equipment manufacturers to save substantial expenditures of time and money.

SUMMARY OF THE INVENTION

The Demountable Tape-Automated Bonding System disclosed and claimed in this patent application solves the problems encountered by conventional chip-to-TAB frame and TAB frame-to-substrate interface systems. The deleterious consequences of using solder and bonding agents for both OLB and ILB connections can be overcome by a modular, pitch-independent, self-aligned design that allows for virtually unlimited disassembly and reassembly. A chip may be either bonded or mounted in place atop a dielectric TAB frame bearing a highly-conductive, corrosion-resistant coating of conductive traces. Closely-spaced conductors protruding from the chip are held against the traces on the TAB frame. The fine traces on the TAB frame are maintained in precise registration with corresponding traces on the substrate, that are, in turn, connected to external devices. The outer leads of the TAB frame are pressed against the substrate traces by compressive forces supplied by a cap and the substrate. Alternative embodiments of the present invention include optional heat sinks and heat spreaders. A bottom frame may be affixed to the substrate to supply additional rigidity to the assembly. One of the embodiments of the invention includes an elastomer inserted between the cap and the substrate which provides the required contact forces between the conductors on the TAB frame and those on the substrate.

The Applicants' invention is a highly serviceable chip interface device that is immune from the serious problems caused by soldering and thermocompression bonding. This innovative method and apparatus provide an effective, efficient, and powerful tool that will enable manufacturers of electronic equipment to create high quality products that will benefit a wide variety of consumers of the electronic and computer systems.

An appreciation of other aims and objectives of the present invention and a more complete and comprehensive understanding of this invention may be achieved by studying the following description of a preferred embodiment and by referring to the accompanying drawings.

BRIEF DESCRIPTION OF THE DRAWINGS

FIG. 1(a) is a cross-sectional view of the basic embodiment of the Demountable Tape-Automated Bonding System which includes a heat sink. FIG. 1(b) is an enlarged view of a portion of FIG. 1(a) that reveals the detail of the connection between a chip and the conductor layer of the TAB frame.

FIG. 2 is a schematic, exploded view of an isometric illustration of the embodiment depicted in FIG. 1.

DETAILED DESCRIPTION OF A PREFERRED EMBODIMENT

Figure 3:
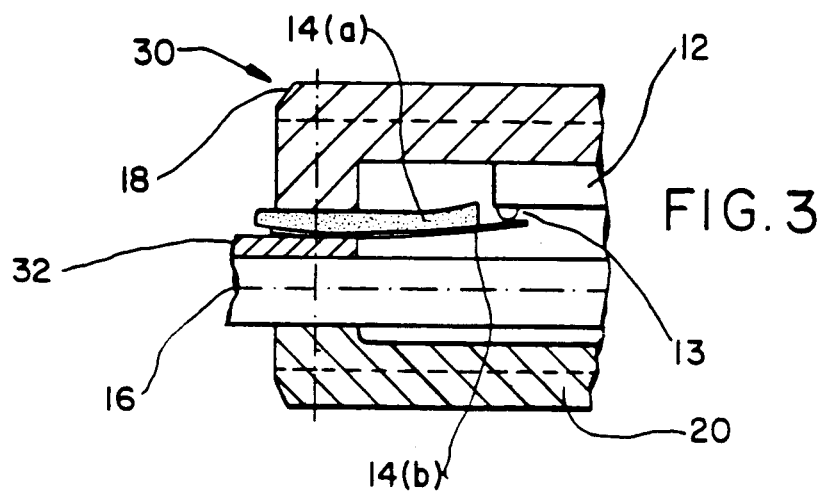
FIG. 3 is a partial cross-sectional diagram that portrays a second embodiment of the present invention which includes a cap and a bottom having orthogonal end portions.

FIG. 1(a) is a cross-sectional view of the basic embodiment of the Demountable Tape-Automated Bonding System 10. A chip 12 having closely-spaced contacts 13 protruding from it resides atop a tape-automated bonding or "TAB" frame 14. As shown more clearly in the enlargement provided by FIG. 1(b), the TAB frame includes a dielectric layer 14a and a conductive layer 14b which engages the contacts 13. In the preferred embodiment, the TAB frame 14 is constructed from two mil thick polyimide film. The arrangement of the chip 12 and TAB frame 14 is maintained by a standard permanent bonding method, such as thermocompression welding, or by the compression supplied by a stainless-steel cap 18 and a metal substrate 16. In this embodiment, four alignment pins 29 maintain accurate positioning of the TAB frame 14 to the substrate 16. Both the cap 18 and the substrate 16 may be fashioned from metal, plastic, or a combination of both. In some circumstances, the substrate 16 may be a printed circuit board. A bottom plate 20 is affixed beneath the substrate 16 to add strength and rigidity to the entire assembly 10. An optional heat sink 22 is shown extending above the cap 18.

FIG. 2 is a schematic, exploded view of an isometric illustration of the embodiment depicted in FIG. 1. Conductive traces 15 formed on the TAB frame 14 and corresponding traces 17 deposited around the four rectilinear edges of the substrate 16 are best seen in the second drawing figure. One of the TAB frames 14 constructed by the inventors includes a conductive pattern 15 of 520 eight mil pitch traces. The traces 15 are 0.5 ounce/square foot copper coated with a layer of gold over a nickel underlayer. The screws 28 which fasten the cap 18, TAB frame 14, substrate 16, and bottom plate 20 are shown above precision-drilled holes 26. Recesses 24 formed at the four corners of the substrate 16 accommodate the heads of screws 28.

FIG. 3 is a partial cross-sectional diagram that portrays an alternative embodiment 30 of the present invention which includes a cap 18 and a bottom 20 having orthogonal end portions.

Figures 4, 5:
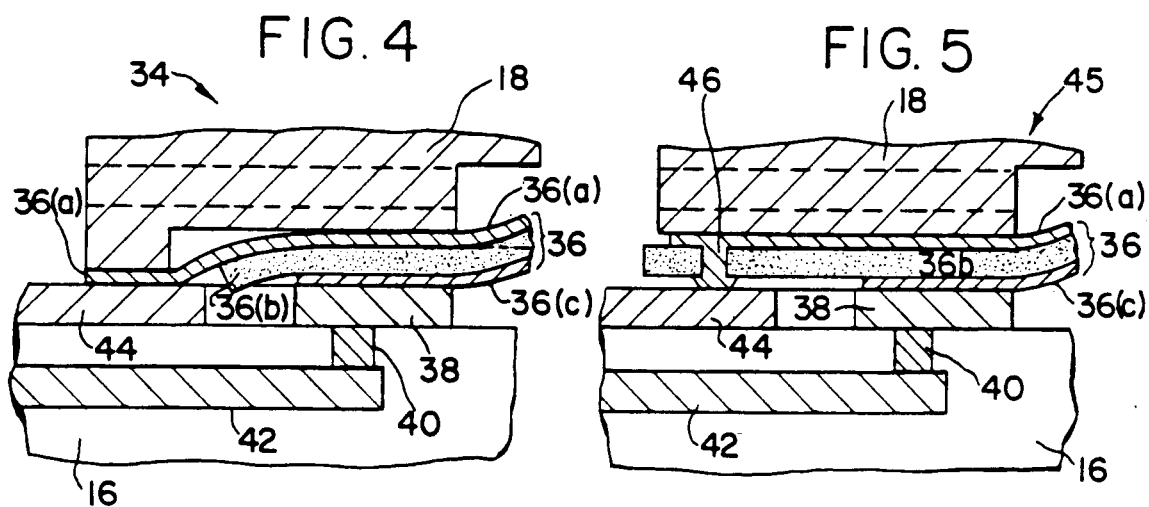
FIG. 4 is a cross-sectional view of a third alternative embodiment of the Demountable Tape-Automated Bonding System which utilizes a double-conductor TAB with a lower conductor layer coupled to a signal line.
FIG. 5 is a cross-sectional view of a fourth alternative embodiment of the present invention showing a double-conductor TAB with a via through the dielectric layer that is coupled to a ground line.

FIG. 4 is a cross-sectional view of another alternative embodiment 34 of the Demountable Tape-Automated Bonding System 10 which utilizes a double-conductor TAB frame 36, which includes an upper conductor layer 36a, a lower conductor layer 36c, and a dielectric layer 36b sandwiched between them. The lower conductor layer 36c is held against an upper signal line 38 that is connected to a vertical via or plated-through hole 40, that is, in turn, connected to a lower signal line 42 embedded in the substrate 16. Upper conductor layer 36a is held against an upper ground line 44 by cap 18.

FIG. 5 is a cross-sectional view of a fourth alternative embodiment of the present invention showing a slightly different double-conductor TAB frame 36. Lower conductor 36c impinges upon upper signal line 38 formed on the surface of substrate 16. Via 40 connects upper signal line 38 to lower signal line 42. Upper conductor 36a is coupled to ground line 44 through a via 46.

Figures 6, 7:
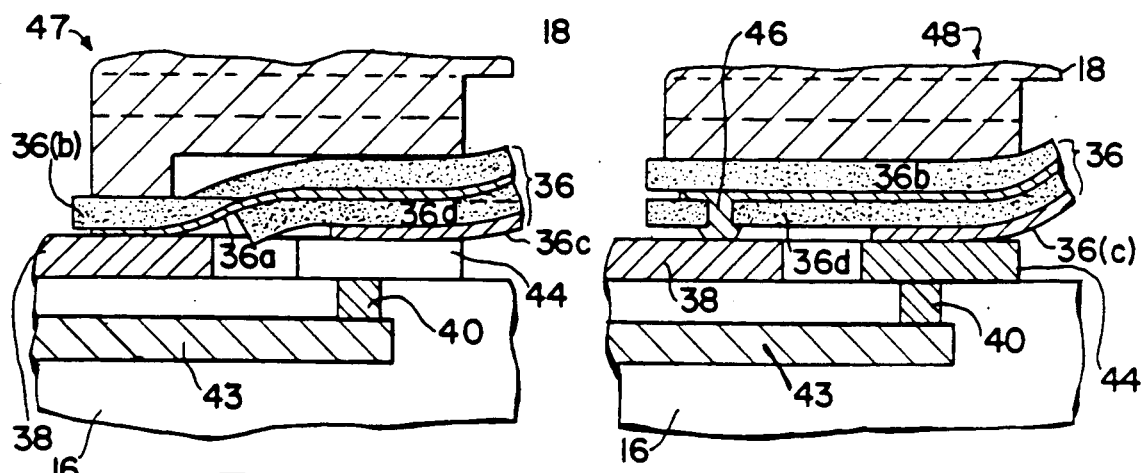
FIG. 6 is a cross-sectional view of fifth alternative embodiment of the present invention depicting a double-conductor TAB with a lower conductor layer coupled to a ground line.
FIG. 7 is a cross-sectional view of sixth alternative embodiment of the Demountable Tape-Automated Bonding System which reveals a double-conductor TAB with a via through the dielectric layer coupled to a signal line.

FIG. 6 is a cross-sectional view of fifth alternative embodiment of the present invention depicting a double-conductor TAB frame 14 that also utilizes a pair of dielectric layers. Cap 18 forces upper dielectric layer 36b to urge conductive layer 36a against upper signal line 38. Lower conductive layer 36c, which is isolated from the upper conductor layer 36a by lower dielectric layer 36d is coupled to upper signal line 44, via 40, and lower signal line 43.

FIG. 7 is a cross-sectional view of sixth alternative embodiment of the Demountable Tape-Automated Bonding System 10 which reveals yet another double-conductor, double-dielectric TAB frame 14. A via 46 connects upper conductor layer 36a to upper signal line 38, while lower conductor layer 36c is impressed upon ground line 44.

Each of the embodiments illustrated by FIGS. 4 through 7 is a variation that enables the designer to select different configurations that provide a wide spectrum of controlled impedance environments.

Figure 8:
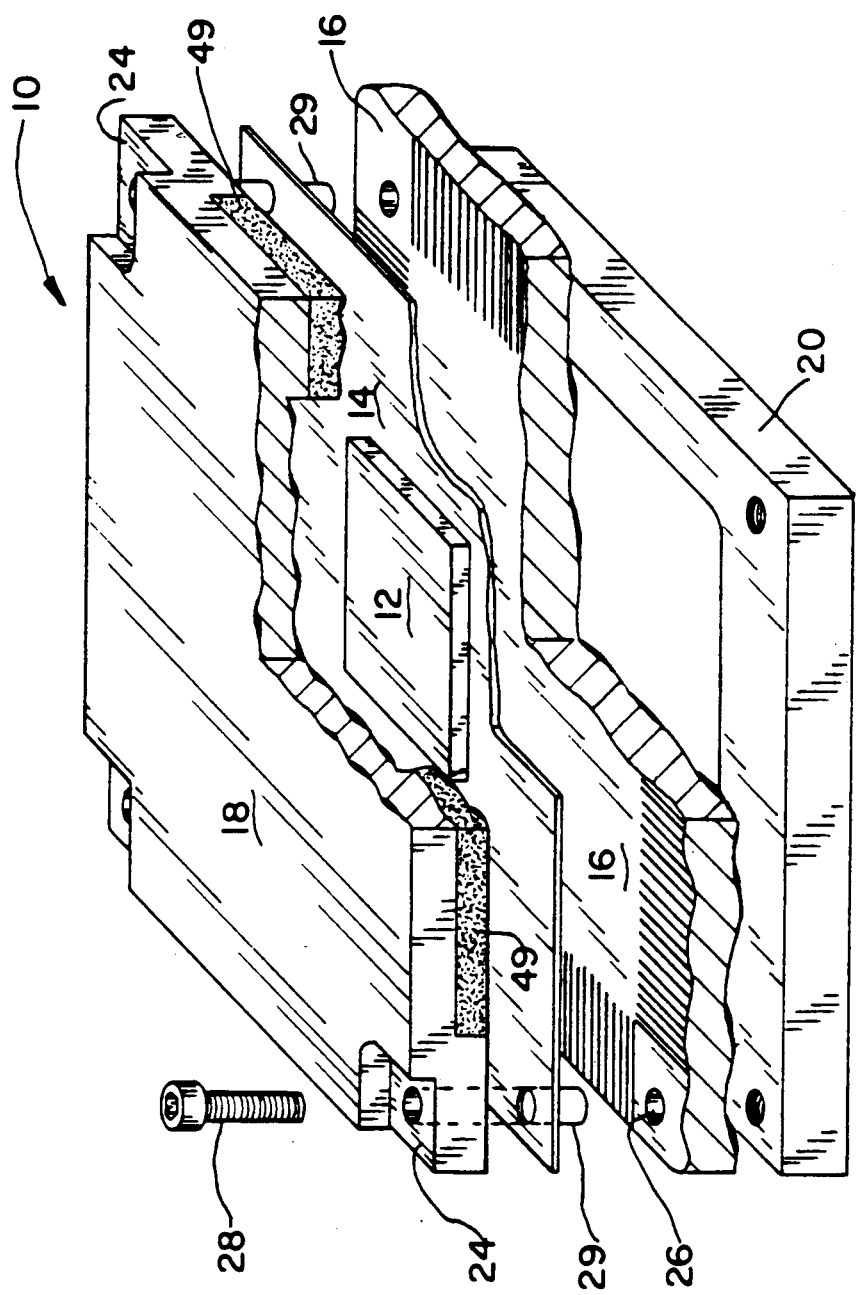
FIG. 8 is an exploded isometric view of another embodiment of the present invention that includes an elastomer above the TAB traces.

FIG. 8 is an exploded isometric view of still another embodiment of the present invention that includes an elastomer 49 consisting of thirty mil thick Viton placed above the chip 12. Any elastomer material which softens the compressive effects of the cap 18 and substrate 16 and allows for just the right amount of squeezing force may be employed when practicing the present invention.

Figure 9:
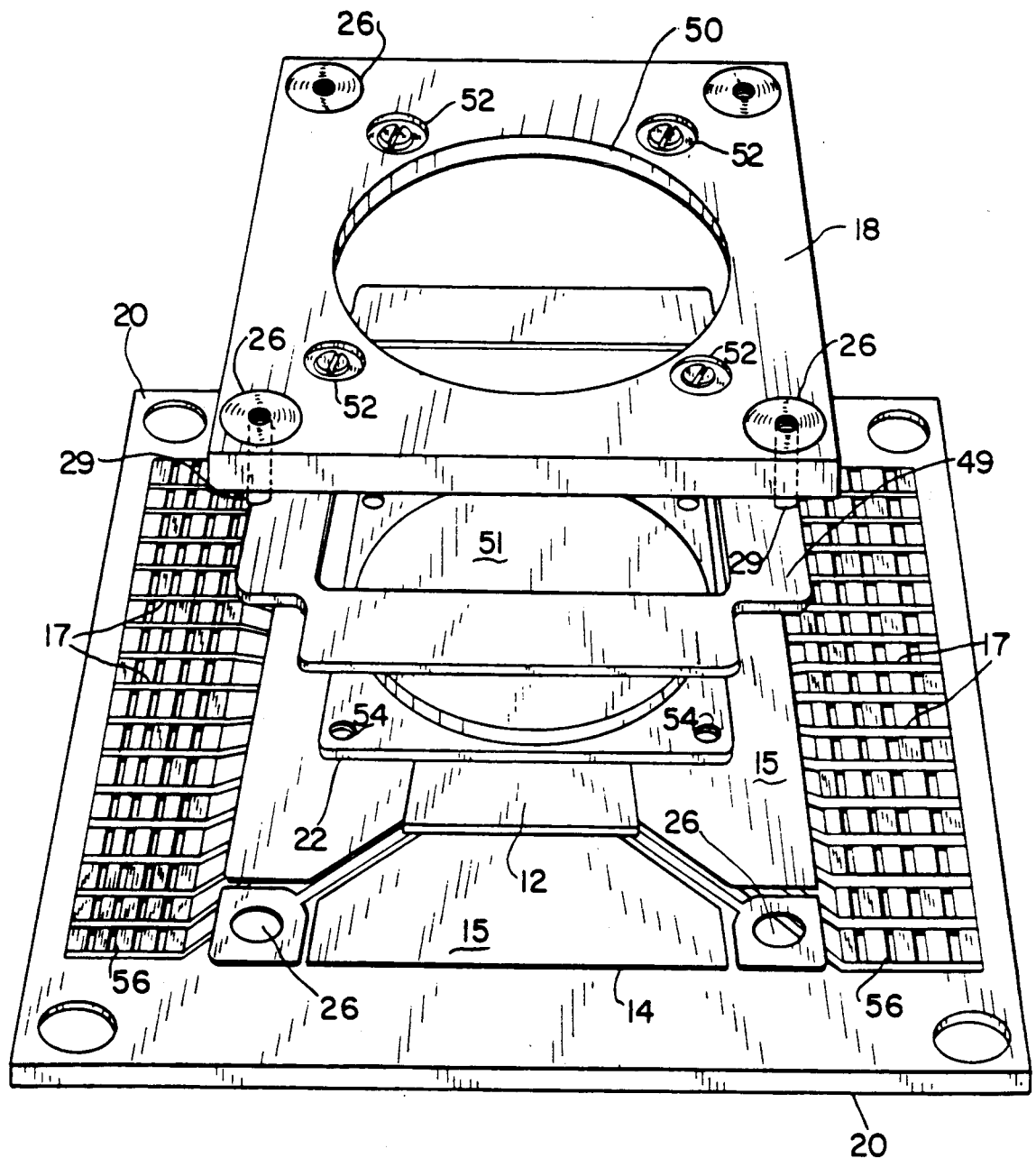
FIG. 9 is an exploded isometric view of yet another embodiment of the invention which utilizes a clamp, an elastomer, and a heat spreader arranged above the chip.

FIG. 9 is an exploded isometric view of yet another embodiment of the invention which utilizes a clamp 18 having a central hole 50, an elastomer 49, and a heat spreader 51 that fits within hole 50 arranged above the chip 12. Screws 52 fasten the clamp or lid 18 to heat spreader 51, while screws 26 maintain the clamp 18, TAB frame 14, and printed circuit board 20 in an accurate mechanical connection. PC board 20 is shown below the TAB frame 14, where traces 15 are mated to similar electrical pathways 17 on the PC board 20. The TAB frame 14 is installed on the substrate 16 after careful alignment is insured.

The Demountable Tape-Automated Bonding System offers a rugged and reliable chip interface that may be used to great advantage in a great number electronic products. This invention constitutes a major step forward in the continually evolving field of electronic packaging and board design.

Although the present invention has been described in detail with reference to a particular preferred embodiment, persons possessing ordinary skill in the art to which this invention pertains will appreciate that various modifications and enhancements may be made without departing from the spirit and scope of the claims that follow.

LIST OF REFERENCE NUMERALS

10 Demountable Tape-Automated Bonding System
12 Chip
13 Contact protruding downward from chip
14 TAB (Tape-Automated Bonding Frame)
14a Dielectric portion of TAB
14b Conductive portion of TAB
15 Conductive traces on TAB
16 Substrate
17 Conductive traces on substrate
18 Cap
20 Bottom
21 Exploded view of Demountable Tape-Automated Bonding System
22 Heat sink
24 Recess at corner of substrate to accommodate screwhead
26 Screw hole
28 Screw
29 Guide pins
30 Cross-sectional view of Alternative embodiment of Demountable Tape-Automated Bonding System
32 Conductive pad on surface of substrate
34 Cross-sectional view of Alternative embodiment of Demountable Tape-Automated Bonding System showing Double-Conductor TAB with lower conductor layer coupled to Signal Line
36 Double-Conductor TAB
36a Upper conductor layer
36b Dielectric layer
36c Lower conductor layer
36d Dielectric layer
38 Upper signal line
40 Via
42 Lower signal line
44 Ground line
45 Cross-sectional view of Alternative embodiment of Demountable Tape-Automated Bonding System showing Double-Conductor TAB with via through dielectric layer coupled to Ground Line
46 Via through dielectric layer of TAB
47 Cross-sectional view of Alternative embodiment of Demountable Tape-Automated Bonding System showing Double-Conductor TAB with lower conductor layer coupled to Ground Line
48 Cross-sectional view of Alternative embodiment of Demountable Tape-Automated Bonding System showing Double-Conductor TAB with via through dielectric layer coupled to Signal Line
49 Elastomer
50 Hole for heat spreader
51 Heat spreader
52 Screws attaching clamp to heat spreader
54 Screw holes through heat spreader for attachment to clamp
56 Conductor pad array

What is claimed is:

1. An apparatus providing an interface to a device having a plurality of closely-spaced conductors comprising:

cap means having a top and sides extending downward therefrom enclosing the device;

tape-automated bonding means being substantially planar with inner and outer edges and a plurality of conductive traces defined thereon extending therebetween with the inner ends of the conductive traces coupled to said closely-spaced conductors of the device; and substrate means including a plurality of conductive traces mated with the outer ends of the conductive traces on said tape-automated bonding means and enveloping said tape-automated bonding means and the device from beneath by effecting closure between the substrate means and the bottom edges of the sides of said cap means with the outer edges of said tape-automated bonding means firmly captured therebetween;

said tape-automated bonding means further including:

an upper and a lower conductive layer;

a dielectric layer located between said conductive layers of said tape-automated bonding means; and said upper conductive layer being held in contact with said cap means; and said substrate means further including:

a conductive upper signal line formed on said substrate means, said signal line being held in contact with said lower conductive layer;

a conductive via and a conductive lower signal line both formed within said substrate means, said via connecting said upper signal line to said lower signal line; and a conductive ground line formed on said substrate means, said ground line being located on a side of said upper conductive layer opposite from said cap means.

2. An apparatus providing an interface to a device having a plurality of closely-spaced conductors comprising:

cap means having a top and sides extending downward therefrom enclosing the device;

tape-automated bonding means being substantially planar with inner and outer edges and a plurality of conductive traces defined thereon extending therebetween with the inner ends of the conductive traces coupled to said closely-spaced conductors of the device; and substrate means including a plurality of conductive traces mated with the outer ends of the conductive traces on said tape-automated bonding means and enveloping said tape-automated bonding means and the device from beneath by effecting closure between the substrate means and the bottom edges of the sides of said cap means with the outer edges of said tape-automated bonding means firmly captured therebetween;

said tape-automated bonding means further including:
an upper and a lower conductive layer;
a dielectric layer located between said conductive layers of said tape-automated bonding means;
said upper conductive layer being held in contact with said cap means; and
a conductive via formed through said dielectric layer, said via being connecting to said upper conductive layer; and said substrate means further including:
a conductive upper signal line formed on said substrate means, said signal line being held in contact with said lower conductive layer;
a conductive via and a conductive lower signal line both formed within said substrate means, said via connecting said conductive upper signal line to said conductive lower signal line; and
a conductive ground line formed on said substrate means, said ground line being held in contact with said via.

3. An apparatus providing an interface to a device having a plurality of closely-spaced conductors comprising:
cap means having a top and sides extending downward therefrom enclosing the device;
tape-automated bonding means being substantially planar with inner and outer edges and a plurality of conductive traces defined thereon extending therebetween with the inner ends of the conductive traces coupled to said closely-spaced conductors of the device; and
substrate means including a plurality of conductive traces mated with the outer ends of the conductive traces on said tape-automated bonding means and enveloping said tape-automated bonding means and the device from beneath by effecting closure between the substrate means and the bottom edges of the sides of said cap means with the outer edges of said tape-automated bonding means firmly captured therebetween;
said tape-automated bonding means further including:
an upper dielectric layer;
an upper conductive layer located below said upper dielectric layer, said upper dielectric layer being held compressively between said cap means and said upper conductive layer of said tape-automated bonding means;
lower dielectric layer located beneath said upper conductive layer; and
a lower conductive layer located beneath said lower dielectric layer of said tape-automated bonding means; and
said substrate means further including:
a conductive upper signal line formed on said substrate means, said signal line being held in contact with said upper conductive layer;
an upper conductive ground line formed on said substrate means, said upper ground line being held in compression below said lower conductive layer; and
a conductive via and a conductive lower ground line formed within said substrate means, said via connecting said upper ground line to said lower ground line.

4. An apparatus providing an interface to a device having a plurality of closely-spaced conductors comprising:
cap means having a top and sides extending downward therefrom enclosing the device;
tape-automated bonding means being substantially planar with inner and outer edges and a plurality of conductive traces defined thereon extending therebetween with the inner ends of the conductive traces coupled to said closely-spaced conductors of the device; and
substrate means including a plurality of conductive traces mated with the outer ends of the conductive traces on said tape-automated bonding means and enveloping said tape-automated bonding means and the device from beneath by effecting closure between the substrate means and the bottom edges of the sides of said cap means with the outer edges of said tape-automated bonding means firmly captured therebetween;
said tape-automated bonding means further including:
an upper dielectric layer;
an upper conductive layer located below said upper dielectric layer, said upper dielectric layer being held compressively between said cap means and said upper conductive layer of said tape-automated bonding means;
a lower dielectric layer located beneath said upper conductive layer;
a lower conductive layer of said tape-automated bonding means located beneath said lower dielectric layer; and
a via formed through said lower dielectric layer, said via being connected to said upper conductive layer; and
said substrate means further including:
a conductive upper signal line formed on said substrate means, said signal line being held in contact with said via;
an upper conductive ground line formed on said substrate means, said upper conductive ground line being held in compression below said lower conductive layer;
a conductive via and a conductive lower ground line formed within said substrate means, said conductive via connecting said upper conductive ground line to said conductive lower ground line.

5. A Demountable Tape-Automated Bonding System providing an interface to a chip comprising:
a substantially planar TAB frame having an upper and a lower surface formed from a polyimide insulative membrane bearing a pattern of conductive traces about its periphery, said TAB frame also receiving said chip on the upper surface;
a printed circuit board precisely aligned with and coupled to a lower surface of said TAB frame opposite the chip and having a pattern of conductive traces which match said conductive traces on said TAB frame;

a top clamp plate attached to the upper surface of said TAB frame opposite said printed circuit board and having a generally central circular hole therethrough;

a heat spreader having a circular top portion with vertically descending sides therefrom and a flange extending outward from the vertically descending sides thereof having a square outline with the top portion fitting within said hole in said top clamp plate and enclosing the chip from above and around the sides thereof; said heat spreader being located below said top clamp plate and above said TAB frame and attached to said top clamp plate; and an elastomer secured between said top clamp plate and said heat spreader.

* * * * *